United States Patent
Sugiura

(10) Patent No.: US 8,008,918 B2
(45) Date of Patent: Aug. 30, 2011

(54) MAGNETIC RESONANCE IMAGING APPARATUS AND SCANNING-CONDITION SETTING METHOD

(75) Inventor: Satoshi Sugiura, Otawara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 183 days.

(21) Appl. No.: 12/543,725

(22) Filed: Aug. 19, 2009

(65) Prior Publication Data
US 2010/0052676 A1 Mar. 4, 2010

(30) Foreign Application Priority Data
Aug. 26, 2008 (JP) ................................. 2008-217169

(51) Int. Cl.
*G01V 3/00* (2006.01)
(52) U.S. Cl. ...................................... 324/318; 324/309
(58) Field of Classification Search .......... 324/300–322, 324/407–445
See application file for complete search history.

(56) References Cited

U.S. PATENT DOCUMENTS

| 4,786,871 | A | | 11/1988 | Hoshino | |
|---|---|---|---|---|---|
| 5,311,131 | A | * | 5/1994 | Smith | 324/309 |
| 5,644,232 | A | * | 7/1997 | Smith | 324/304 |
| 5,818,231 | A | * | 10/1998 | Smith | 324/309 |
| 7,034,533 | B2 | * | 4/2006 | Mugler et al. | 324/318 |
| 7,362,101 | B2 | * | 4/2008 | Muftuler et al. | 324/318 |

FOREIGN PATENT DOCUMENTS

| JP | 2004-357834 | 12/2004 |
|---|---|---|
| JP | 2006-255189 | 9/2006 |

* cited by examiner

*Primary Examiner* — Brij B Shrivastav
(74) *Attorney, Agent, or Firm* — Nixon & Vanderhye PC

(57) ABSTRACT

A Signal-to-Noise (SN) ratio maintained scanning-condition recalculating unit re-sets a value of a scanning parameter other than an SN ratio included in scanning conditions when the size of a Field Of View (FOV) to be set for a scan is changed, so as to make the SN ratio of an image to be taken under after-change scanning conditions equal to or larger than the SN ratio of an image assumed to be taken under before-change scanning conditions. A scanning-condition edit/scan positioning unit then sets scanning conditions based on the value of the scanning parameter recalculated by the scanning-condition recalculating unit.

20 Claims, 7 Drawing Sheets

ENLARGE FOV
IN READOUT DIRECTION

REDUCE FOV
IN READOUT DIRECTION

ENLARGE FOV
IN PHASE ENCODING DIRECTION

REDUCE FOV
IN PHASE ENCODING DIRECTION

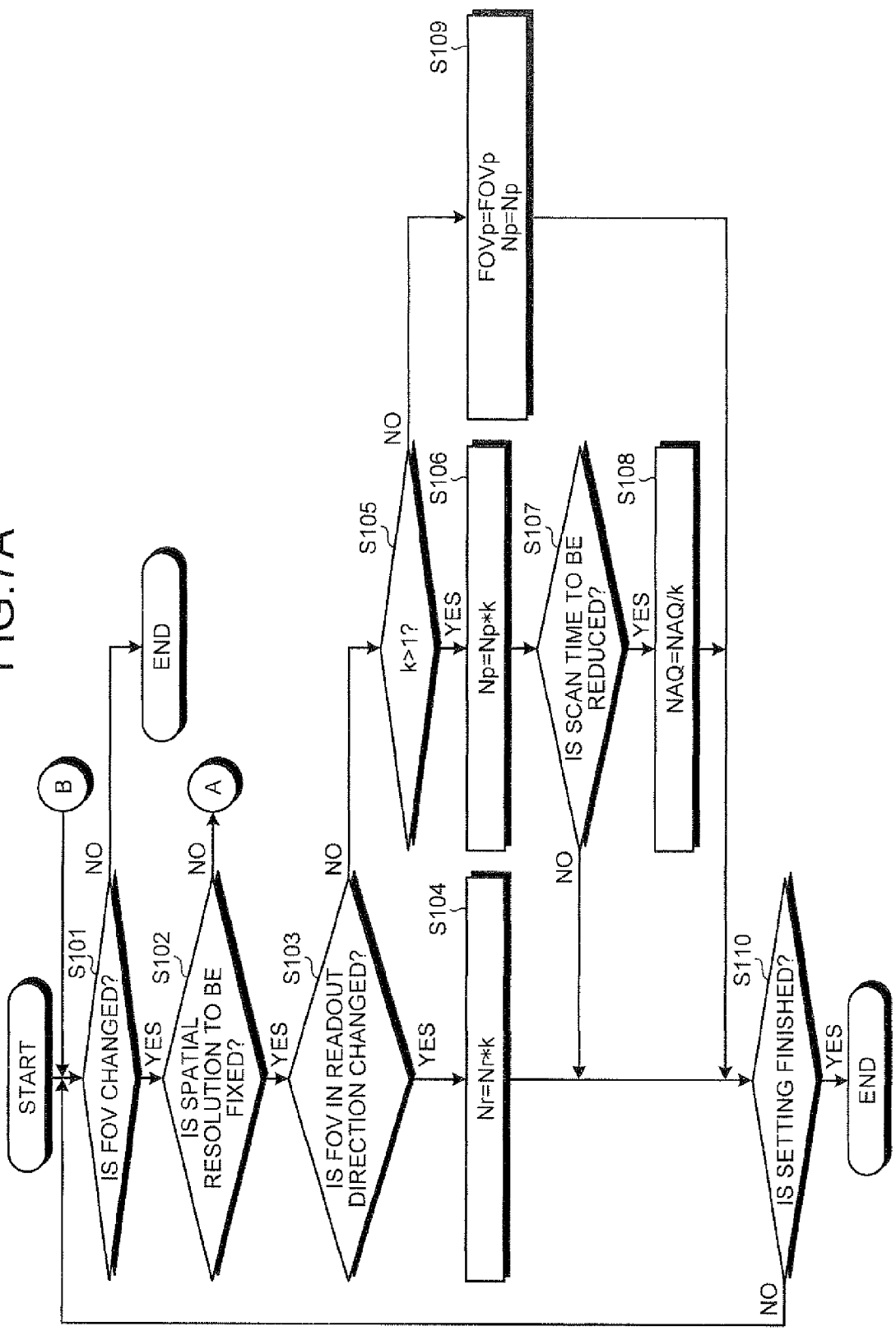

ENLARGE FOV IN SLICE ENCODING DIRECTION

REDUCE FOV IN SLICE ENCODING DIRECTION

MAGNETIC RESONANCE IMAGING APPARATUS AND SCANNING-CONDITION SETTING METHOD

CROSS-REFERENCE TO RELATED APPLICATIONS

This application is based upon and claims the benefit of priority from the prior Japanese Patent Application No. 2008-217169, filed on Aug. 26, 2008; the entire contents of which are incorporated herein by reference.

BACKGROUND OF THE INVENTION

1. Field of the Invention

The present invention relates to a magnetic resonance imaging apparatus that images the inside of a subject by using a magnetic resonance phenomenon, and a scanning-condition setting method. The present invention particularly relates to a technology for controlling a scanning parameter so as to make a Signal-to-Noise (SN) ratio of an image to be obtained through a scan constantly higher than a certain value.

2. Description of the Related Art

A magnetic resonance imaging method used by a magnetic resonance imaging apparatus is a method of acquiring chemical and physical microscopic information about a substance by using a magnetic resonance phenomenon. The magnetic resonance phenomenon is a phenomenon that when being placed in a magnetic field, an aggregation of subject nuclear spins resonates with a radio-frequency magnetic field in which each atomic nucleus spins at a particular frequency (resonance frequency) responding to its own unique magnetic moment and an existing magnetic field, and generates a signal (magnetic resonance signal) in a relaxation process.

According to the magnetic resonance imaging apparatus, the Signal-to-Noise (SN) ratio of an image, the spatial resolution, the scan time, or the like depends on, for example, the type of a pulse sequence or a scanning parameter of the pulse sequence, such as a Field Of View (FOV), a scan matrix, the number of acquisition (number of excitation), or a receiving band. For this reason, the MRI apparatus is an apparatus that needs to set especially various scanning conditions among medical devices.

The SN ratio of an image obtained by the magnetic resonance imaging apparatus has a large influence on the image quality of the obtained image. Sometimes an image of a low SN ratio brings about an obstacle to diagnosis, therefore, it needs to obtain an SN ratio constantly higher than a certain value. To secure a stable SN ratio, usually, scanning parameters are preliminarily registered into the apparatus as default scanning conditions with respect to each scan area, each clinical field, or each disease, and then a scan is performed under the scanning conditions every time.

However, because there are individual differences in the sizes of scan subjects (examination subjects), the FOV, the slice thickness, the slab thickness in a case of three-dimensional scanning, and the like need to be adjusted for each scan in accordance with the size of a scan subject, even if almost all of the other parameters can be kept constant. If the adjustment is not performed, aliasing may occur in an image, or a redundant area may be imaged, in some cases.

Although an adjustment of an FOV is often manually performed by an operator, a method of automatically setting an FOV by measuring the size of an examination subject with a system is proposed (for example, see JP-A H3-16851 (KOKOKU)). Usually, when the FOV is changed, a voxel size changes, so that the SN ratio of an image changes along with the change. Consequently, to keep the SN ratio constant, the operator needs to recover the SN ratio by correcting a parameter other than the changed FOV. Therefore, a method is proposed of predicting to what extent the SN ratio changes with respect to a change in a scanning parameter from the value of the scanning parameter before the change and notifying the operator of the predicted change in the SN ratio (for example, see JP-A 2004-357834 (KOKAI)).

However, when changing the FOV, it is not simply found out which parameter and to what extent needs to be changed in order to return the SN ratio to the original value from a change in the SN ratio arising from the change in the FOV. The reason for this is because such conditions vary depending on a functional direction of the FOV (whether a readout direction or a phase encoding direction).

For this reason, an operation of setting scanning conditions in which the same SN ratio is constantly maintained while changing the FOV requires a skill and an understanding of the principles of scanning according to the magnetic resonance imaging method. Such operation is substantially time consuming for an inexperienced operator, and sometimes results in a problem of an extension of a total examination time in some cases.

SUMMARY OF THE INVENTION

According to one aspect of the present invention, a magnetic resonance imaging apparatus that images an inside of a subject by using a magnetic resonance phenomenon, the apparatus includes a scanning-condition recalculating unit that recalculates a value of a scanning parameter other than a Signal-to-Noise (SN) ratio included in scanning conditions when a size of a Field Of View (FOV) to be set for a scan is changed, so as to make an SN ratio of an image to be taken under after-change scanning conditions be one of a value equal to and a value larger than an SN ratio of an image assumed to be taken under before-change scanning conditions; and a scanning-condition setting unit that sets a scanning condition based on the value of the scanning parameter recalculated by the scanning-condition recalculating unit.

According to another aspect of the present invention, a magnetic resonance imaging apparatus that images an inside of a subject by using a magnetic resonance phenomenon, the apparatus includes a scanning-condition recalculating unit that recalculates a value of a scanning parameter other than a Signal-to-Noise (SN) ratio included in scanning conditions when a size of a Field Of View (FOV) to be set for a scan is changed, so as to make an SN ratio of an image to be taken under after-change scanning conditions be one of a value equal to and a value larger than an SN ratio of an image assumed to be taken under before-change scanning conditions; and a scanning-condition notifying unit that provides a notice of the value of the scanning parameter recalculated by the scanning-condition recalculating unit.

According to still another aspect of the present invention, a scanning-condition setting method of a magnetic resonance imaging apparatus, the method includes recalculating a value of a scanning parameter other than an SN ratio included in scanning conditions when a size of an FOV to be set for a scan is changed, so as to make an SN ratio of an image to be taken under after-change scanning conditions be one of a value equal to and a value larger than an SN ratio of an image assumed to be taken under before-change scanning conditions; and setting a scanning condition based on the recalculated value of the scanning parameter.

BRIEF DESCRIPTION OF THE DRAWINGS

FIGS. 7A and 7B are a flowchart of a flow of recalculation of scanning conditions according to the embodiment;

DETAILED DESCRIPTION OF THE INVENTION

Exemplary embodiments of a magnetic resonance imaging apparatus and a scanning-condition setting method according to the present invention will be explained below in detail with reference to the accompanying drawings. A Magnetic Resonance Imaging apparatus is referred to as an MRI apparatus in the following description.

An MRI apparatus according to an embodiment of the present invention is configured to perform a scan based on default scanning conditions that are preliminarily registered. When a Field Of View (FOV) is changed, the MRI apparatus changes the value of another scanning parameter so as to make a Signal-to-Noise (SN) ratio equal to a SN ratio in the default scanning conditions based on a predefined calculating method. Two cases are conceivable for the spatial resolution, namely, a case of setting a spatial resolution to the same as that in the preliminarily-registered default scanning conditions, and a case of changing the spatial resolution in accordance with the size of a scan subject, so that respective calculating methods are defined for the two cases, and made selectable for the operator.

Figure 1:
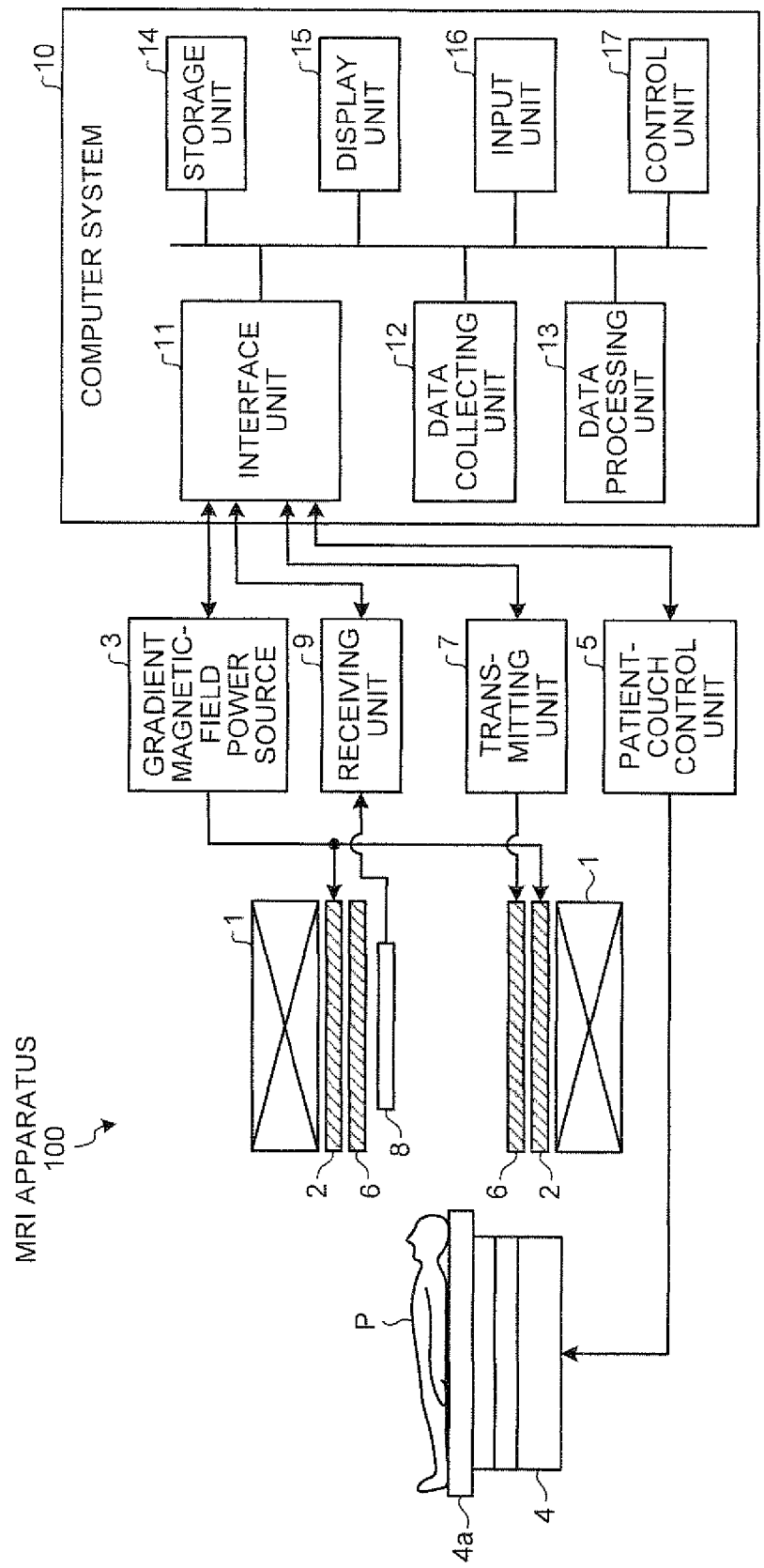
FIG. 1 is a schematic diagram of a Magnetic Resonance Imaging (MRI) apparatus according to an embodiment of the present invention.

First of all, a configuration of the MRI apparatus according to the embodiment is explained below with reference to FIG. 1. FIG. 1 is a schematic diagram of a configuration of the MRI apparatus according to the embodiment. As shown in the figure, an MRI apparatus 100 according to the embodiment includes a static magnetic-field magnet 1, a gradient magnetic-field coil 2, a gradient magnetic-field power source 3, a patient couch 4, a patient-couch control unit 5, an RF transmitting coil 6, a transmitting unit 7, an RF receiving coil 8, a receiving unit 9, and a computer system 10.

The static magnetic-field magnet 1 is formed in a hollow cylindrical shape, and generates a uniform static magnetic field in its inside space. For example, a permanent magnet, or a super conducting magnet is used as the static magnetic-field magnet 1.

The gradient magnetic-field coil 2 is formed in a hollow cylindrical shape, and is arranged inside the static magnetic-field magnet 1. The gradient magnetic-field coil 2 is formed of three coils in combination corresponding to x, y, and z axes orthogonal to one another. The three coils generate gradient magnetic fields of which field strengths vary along three directions of the x, y, and z axes, respectively, by individually receiving a current supply from the gradient magnetic-field power source 3, which will be described later. It is assumed that the z axis direction is the same direction as that of the static magnetic field.

The gradient magnetic fields of the x, y, and z axes generated by the gradient magnetic-field coil 2 correspond to, for example, a slice-selective gradient magnetic field Gs, a phase encoding gradient magnetic field Ge, and a readout gradient magnetic field Gr, respectively. The slice-selective gradient magnetic field Gs is used for arbitrarily setting a scan cross section. The phase encoding gradient magnetic field Ge is used for changing the phase of a magnetic resonance signal in accordance with a spatial position. The readout gradient magnetic field Gr is used for changing the frequency of a magnetic resonance signal in accordance with a spatial position.

The gradient magnetic-field power source 3 supplies a current to the gradient magnetic-field coil 2 based on pulse-sequence execution data sent from the computer system.

The patient couch 4 is includes a top plate 4a on which a subject P is to be placed, and under the control of the patient-couch control unit 5, which will be described later, the patient couch 4 inserts the top plate 4a on which the subject P is placed, into a hole (a scanning space) of the gradient magnetic-field coil 2. Usually, the patient couch 4 is placed such that the longitudinal direction of the patient couch 4 is to be parallel to the central axis of the static magnetic-field magnet 1.

The patient-couch control unit 5 moves the top plate 4a in the longitudinal direction and upward and downward by driving the patient couch 4.

The RF transmitting coil 6 is arranged inside the gradient magnetic-field coil 2, and generates a radio-frequency magnetic field by receiving supply of a radio-frequency pulse from the transmitting unit 7.

The transmitting unit 7 transmits a radio-frequency pulse corresponding to a Larmor frequency to the RF transmitting coil 6 based on pulse-sequence execution data sent from the computer system. The transmitting unit 7 includes an oscillating unit, a phase selecting unit, a frequency converting unit, an amplitude modulating unit, a radio-frequency power amplifying unit, and the like.

The oscillating unit generates a radio-frequency signal of a resonance frequency unique to a subject nucleus in the static magnetic field. The phase selecting unit selects a phase of the radio-frequency signal. The frequency converting unit converts the frequency of the radio-frequency signal output by the phase selecting unit. The amplitude modulating unit modulates the amplitude of the radio-frequency signal output by the frequency converting unit in accordance with, for example, a sinc function. The radio-frequency power amplifying unit amplifies the radio-frequency signal output by the amplitude modulating unit. As a result of operations performed by the above units, the transmitting unit 7 transmits a radio-frequency pulse corresponding to a Larmor frequency to the RF transmitting coil 6.

The RF receiving coil 8 is arranged inside the gradient magnetic-field coil 2, and receives a magnetic resonance signal emitted from the subject owing to an influence of the radio-frequency magnetic field described above. Upon receiving a magnetic resonance signal, the RF receiving coil 8 outputs the magnetic resonance signal to the receiving unit 9.

The receiving unit 9 creates magnetic-resonance signal data based on the magnetic resonance signal output by the RF receiving coil 8 based on pulse-sequence execution data sent from the computer system. After creating magnetic-resonance signal data, the receiving unit 9 transmits the magnetic-resonance signal data to the computer system 10.

The computer system 10 performs total control of the MRI apparatus 100, data collection, image reconstruction, and the like. The computer system 10 includes an interface unit 11, a data collecting unit 12, a data processing unit 13, a storage unit 14, a display unit 15, an input unit 16, and a control unit 17.

The interface unit 11 is connected to the gradient magnetic-field power source 3, the patient-couch control unit 5, the transmitting unit 7, and the receiving unit 9; and controls input and output of signals that are given and received between each of the connected units and the computer system 10.

The data collecting unit 12 collects magnetic-resonance signal data transmitted from the receiving unit 9 via the interface unit 11. When magnetic-resonance signal data is collected, the data collecting unit 12 stores the collected magnetic-resonance signal data into the storage unit 14.

The data processing unit 13 performs post-processing, i.e., reconstruction processing, such as a Fourier transform, on the magnetic-resonance signal data stored in the storage unit 14, and creates spectrum data or image data of a desired nuclear spin inside the subject P.

The storage unit 14 stores magnetic-resonance signal data collected by the data collecting unit 12, and image data created by the data processing unit 13, with respect to each subject P.

The display unit 15 displays various information, such as spectrum data or image data, under the control of the control unit 17. A display device, such as a liquid crystal display, can be used as the display unit 15.

The input unit 16 receives various operations and information input from an operator. As the input unit 16, a pointing device, such as a mouse or a trackball, a selecting device, such as a mode switch, and an input device, such as a keyboard, can be used as required.

The control unit 17 includes a Central Processing Unit (CPU) and a memory, both of which are not shown, and controls the MRI apparatus 100 overall.

As described above, a general configuration of the MRI apparatus 100 according to the embodiment has been explained. Under such configuration, according to the MRI apparatus 100 according to the embodiment, the computer system 10 controls parameters other than the SN ratio so as to obtain a constant SN ratio automatically even when the size of the FOV is changed, thereby achieving improvement in operationality. The computer system 10 is explained below in detail.

Figure 2:
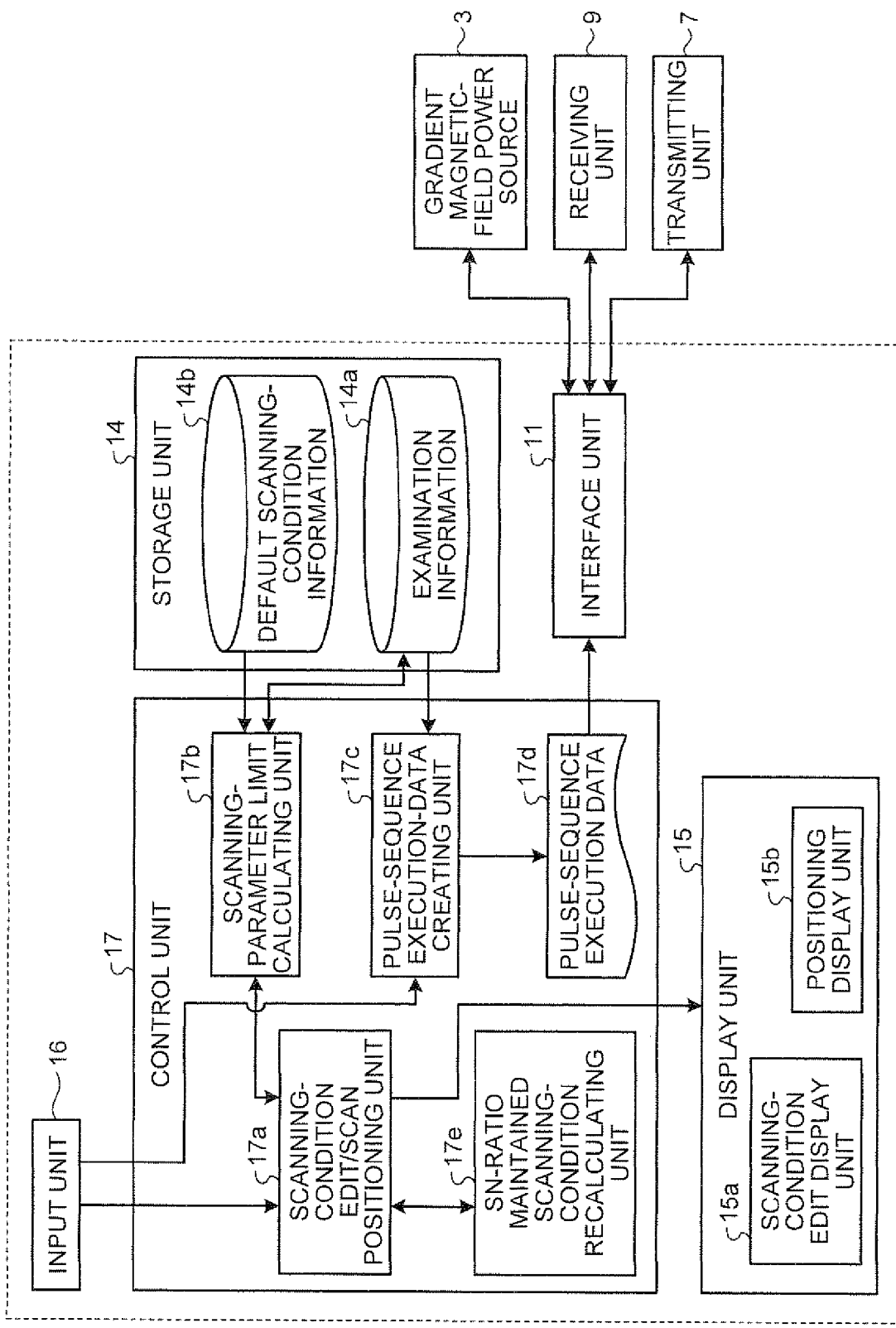
FIG. 2 is a functional block diagram of a detailed configuration of a computer system shown in FIG. 1.

At first, a detailed configuration of the computer system 10 is explained below with reference to FIG. 2. FIG. 2 is a functional block diagram of a detailed configuration of the computer system 10. The figure shows configurations particularly relevant to the present invention among configurations that the storage unit 14, the display unit 15, and the control unit 17 have, and interrelations between the interface unit 11, the storage unit 14, the display unit 15, the input unit 16, and the control unit 17.

As shown in the figure, the storage unit 14 particularly stores examination information 14a and default scanning-condition information 14b.

The examination information 14a is information that indicates scanning conditions appropriate to each scan type, and includes values set in various scanning parameters included in the scanning conditions, such as the type of a can, the position of a slice (cross section), the slice thickness, and the number of slices.

The default scanning-condition information 14b is information that defines a combination of scanning conditions that are predetermined and categorized in terms of the examination part, the examination purpose, the diseases, and the like. The default scanning-condition information 14b includes the type of a pulse sequence, the Repetition Time (TR), the Echo Time (TE), the number of acquisition (NAQ), the Field Of View (FOV), the slice thickness, the slice interval, the number of slices, the number of elements in a matrix, the flip angle, and the like, all of which are preset scan by scan.

Usually, it is configured to obtain constantly a contrast, a spatial resolution, and a SN ratio at respective certain values, by scanning under scanning conditions defined by the default scanning-condition information 14b. A facility or an operator that uses the apparatus can individually set the default scanning-condition information 14b in addition to information that is preliminarily incorporated in the apparatus.

As shown in the figure, the display unit 15 particularly includes a scanning-condition edit display unit 15a and a positioning display unit 15b.

The scanning-condition edit display unit 15a displays information about scanning conditions to be set for a scan. Specifically, under the control of a scanning-condition edit/scan positioning unit 17a, the scanning-condition edit display unit 15a displays on the display unit 15 a scanning-condition edit screen for receiving an operation relevant to setting of scanning conditions from the operator. The operator can set scanning conditions by setting respective values into the scanning parameters displayed on the scanning-condition edit screen via the input unit 16.

The positioning display unit 15b displays a positioning image to be a reference when determining the position of a slice to be scanned, and displays a figure (such as a rectangle) indicating an FOV on the positioning image based on scanning conditions set by the operator. When a scanning condition is changed by the operator, the positioning display unit 15b changes the position and/or the shape of a figure indicating an FOV in a synchronized manner with display of the scanning conditions by the scanning-condition edit display unit 15a.

As shown in the figure, the control unit 17 particularly includes the scanning-condition edit/scan positioning unit 17a, a scanning-parameter limit calculating unit 17b, a pulse-sequence execution-data creating unit 17c, a pulse-sequence execution data 17d, and an SN ratio maintained scanning-condition recalculating unit 17e.

The scanning-condition edit/scan positioning unit 17a receives information about edit of a scanning condition and positioning of a slice. Specifically, to begin with, when receiving a display request for the scanning-condition edit screen via the input unit 16, the scanning-condition edit/scan positioning unit 17a controls and causes the scanning-condition edit display unit 15a to display the scanning-condition edit screen.

When receiving an operation of setting scanning conditions via the input unit 16, the scanning-condition edit/scan positioning unit 17a passes values set in the scanning parameters on the scanning-condition edit screen to the scanning-parameter limit calculating unit 17b parameter by parameter of the scanning parameters. When a limit value of a scanning parameter is replied from the scanning-parameter limit calculating unit 17b, the scanning-condition edit/scan positioning unit 17a controls the scanning-condition edit display unit 15a, and causes it to display replied limit values parameter by parameter of the scanning parameters on the scanning-condition edit screen.

The scanning-parameter limit calculating unit 17b calculates a limit value of a scanning parameter. Specifically, upon receiving the value of a scanning parameter from the scanning-condition edit/scan positioning unit 17a, the scanning-parameter limit calculating unit 17b calculates a limit value of another scanning parameter that depends on the received value of the scanning parameter. The scanning-parameter limit calculating unit 17b then returns the calculated limit value of the scanning parameter to the scanning-condition edit/scan positioning unit 17a, and each time stores the received value of the scanning parameter and the calculated value of the scanning parameter into the storage unit 14 as the examination information 14a.

Moreover, when the operator requires display of default scanning conditions via the input unit 16 and the scanning-condition edit/scan positioning unit 17a, the scanning-parameter limit calculating unit 17b acquires information about required default scanning conditions from the default scanning-condition information 14b, and replies to the scanning-condition edit/scan positioning unit 17a.

The pulse-sequence execution-data creating unit 17c causes execution of a scan by using the examination information 14a stored in the storage unit 14. Specifically, when receiving the start instruction for a scan via the input unit 16, the pulse-sequence execution-data creating unit 17c creates the pulse-sequence execution data 17d based on scanning conditions stored as the examination information 14a in the storage unit 14, and then causes the gradient magnetic-field power source 3, the transmitting unit 7, and the receiving unit 9 to execute a scan by sending the created pulse-sequence execution data 17d.

When the operator or the system changes the FOV, the slab thickness, or the like in accordance with the size of a scan subject, the SN-ratio maintained scanning-condition recalculating unit 17e recalculates another scanning condition so as to make the SN ratio of an image equal to that of an image that is a reference image before change. Recalculation of scanning parameters performed by the SN-ratio maintained scanning-condition recalculating unit 17e is concretely explained below.

Usually, an image SN ratio obtained by the MRI apparatus can be expressed by Expression (1) described below by ignoring effects of the relaxation time, the density of hydrogen nuclei, the velocity, the diffusion, and the like. When the FOV is changed, the MRI apparatus 100 according to the embodiment recalculates the value of a scanning parameter based on Expression (1).

$$S/N \propto \text{voxel size} \times \sqrt{\frac{\text{total data collection time}}{}} = (FOVp/Np) \times$$

$$(FOVr/Nr) \times ST \times$$

$$\sqrt{\frac{NAQ \times Np \times}{Nr \times \Delta t}}$$

$$= (FOVp/Np) \times$$

$$(FOVr/Nr) \times ST \times$$

$$\sqrt{NAQ \times Np/BW} \quad (1)$$

In Expression (1), FOVp denotes the FOV in the phase encoding direction, FOVr denotes the FOV in the readout direction, Np denotes the number of elements in the phase encoding direction in a matrix (hereinafter, referred to as "phase encoding matrix"), Nr denotes the number of elements in the readout direction in the matrix (hereinafter, referred to as "readout matrix"), ST denotes the slice thickness, NAQ denotes the number of acquisition, $\Delta t$ denotes the sampling patchy and BW denotes a signal band per pixel.

As is clear from Expression (1), when the FOV in the phase encoding direction FOVp is changed; as Np is changed in the same proportion so as to change the voxel size correspondingly, FOVp/Np is kept constant. However, according to the relation expressed in Expression (1), when Np is changed, the number of times of data collection, i.e., a total data collection time, also changes, consequently the SN ratio is not maintained.

A scan time Tacq can be expressed by Expression (2) as follows:

$$Tacq \propto TR \times NAQ \times Np \quad (2)$$

The recalculation of scanning parameters performed by the SN-ratio maintained scanning-condition recalculating unit 17e is explained below in detail with reference to FIGS. 3 to 6. A case of maintaining the same spatial resolution as its default scanning condition that is preliminarily registered, and a case of changing the spatial resolution in accordance with the size of a scan subject are separately explained below.

The case of maintaining the same spatial resolution as its default scanning condition is explained below at first, by dividing into four cases shown in FIGS. 3 and 6.

Figure 3:
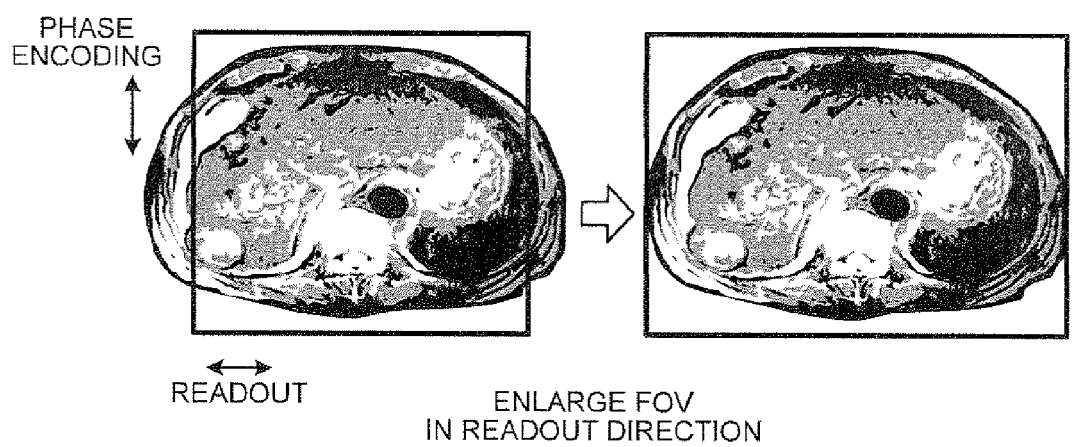
FIG. 3 is a schematic diagram of a case where a Field Of View (FOV) in a readout direction is enlarged to k times (k>1) its default scanning condition in accordance with the size of a scan subject.

FIG. 3 shows a case where the FOV in the readout direction FOVr is enlarged to k times (k>1) its default scanning condition in accordance with the size of a scan subject.

In this case, the SN-ratio maintained scanning-condition recalculating unit 17e multiplies the readout matrix Nr by k times in order to meet the default scanning condition of the spatial resolution. Accordingly, based on the relation expressed in Expression (1), the SN ratio becomes equal to its default scanning condition. The scan time is also maintained based on the relation expressed in Expression (2).

According to the MRI apparatus, sometimes the readout matrix Nr can take only discrete values, such as the powers of two, due to limitations of hardware, in some cases. However, when Nr is multiplied by k times, a result of the multiplication sometimes does not become a power of two in some cases. In such case, the SN-ratio maintained scanning-condition recalculating unit 17c sets the readout matrix to a power of two that is larger than and the closest to the value of k times an original Nr.

Accordingly, data collection of the FOV is performed through over sampling. As a result, the data processing unit 13 reconstructs an image larger than an image of a size set by the operator or the system; however, the SN-ratio maintained scanning-condition recalculating unit 17e can control the display unit 15 so as to display the area set by the operator or the system by cutting it out from an image reconstructed from collected data.

For example, it is assumed that when FOVr in the default scanning conditions is 256 millimeters, the operator or the system sets FOVr to 307 millimeters, which is 1.2 times its default scanning condition, because an examination subject is larger than 256 millimeters in terms of FOVr. In such case, the SN-ratio maintained scanning-condition recalculating unit 17e increases Nr by 1.2 times to 307 so as to maintain the spatial resolution.

When Nr cannot take value other than a power of two due to limitations of hardware, the SN-ratio maintained scanning-condition recalculating unit 17e sets Nr to 512, and FOVr to 512 millimeters. The SN-ratio maintained scanning-condition recalculating unit 17e then controls the display unit 15 so as to display the part of 307 millimeters set by the operator or the system by cutting it out from a reconstructed image.

Figure 4:
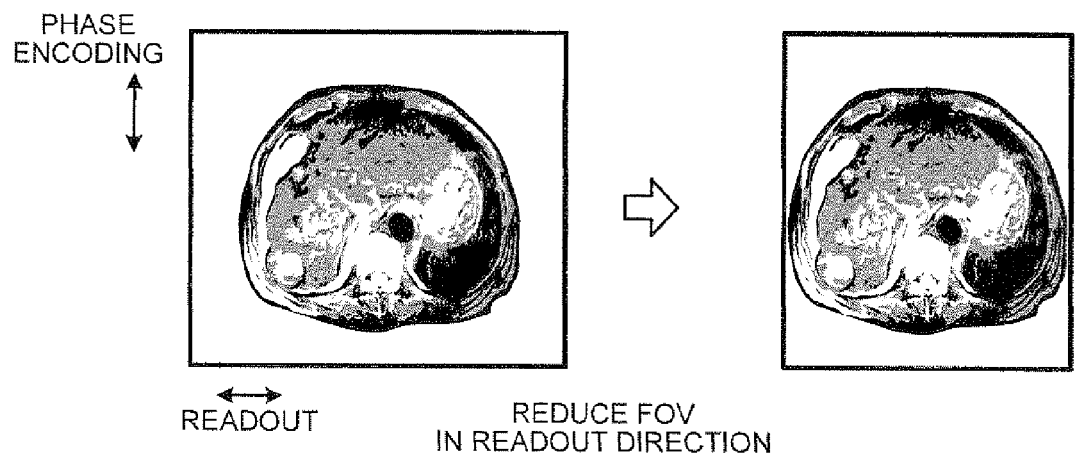
FIG. 4 is a schematic diagram of a case where an FOV in the readout direction is reduced to k times (k<1) its default scanning condition in accordance with the size of a scan subject.

FIG. 4 shows a case where the FOV in the readout direction FOVr is reduced to k times (k<1) its default scanning condition in accordance with the size of a scan subject.

In this case, the SN-ratio maintained scanning-condition recalculating unit 17e also multiplies the readout matrix Nr by k times in order to meet the default scanning condition of the spatial resolution. Accordingly, based on the relation expressed in Expression (1), the SN ratio becomes equal to its default scanning condition. The scan time is also maintained based on the relation expressed in Expression (2).

For example, it is assumed that when FOVr in the default scanning conditions is 256 millimeters, the operator or the system sets FOVr to 205 millimeters, which is 0.8 times its default scanning condition, because an examination subject is smaller than 256 millimeters in terms of FOVr. In such case, the SN-ratio maintained scanning-condition recalculating unit 17e reduces Nr by 0.8 times to 205 so as to maintain the spatial resolution.

When Nr cannot take value other than the value of a power of two due to limitations of hardware, the SN-ratio maintained scanning-condition recalculating unit 17e sets Nr to 256, and FOVr to 256 millimeters. After data collection is performed under the set scanning condition, the SN-ratio maintained scanning-condition recalculating unit 17e then controls the display unit 15 so as to display the part of 205 millimeters set by the operator or the system by cutting it out from a reconstructed image.

Figure 5:
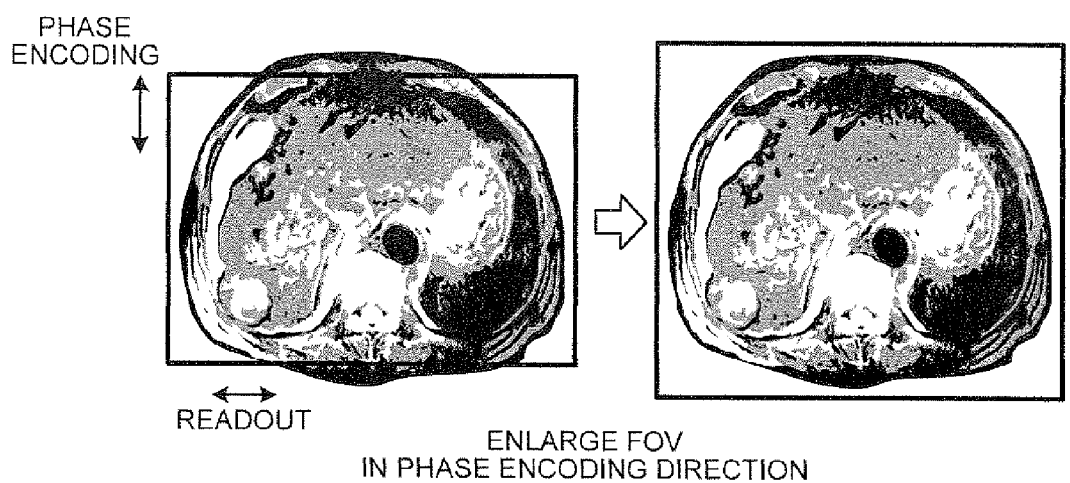
FIG. 5 is a schematic diagram of a case where an FOV in a phase encoding direction is enlarged to k times (k>1) its default scanning condition in accordance with the size of a scan subject.

FIG. 5 shows a case where the FOV in the phase encoding direction FOVp is enlarged to k times (k>1) its default scanning condition in accordance with the size of a scan subject.

In this case, the SN-ratio maintained scanning-condition recalculating unit 17e multiplies the readout matrix Nr by k times in order to meet the default scanning condition of the spatial resolution. Accordingly, based on the relation expressed in Expression (1), the SN ratio is improved to $\sqrt{k}$ times its default scanning condition. Based on the relation expressed in Expression (2), the scan time is extended by k times. If an extension of the scan time is accepted, the SN-ratio maintained scanning-condition recalculating unit 17e only multiplies Nr by k times, and completes the recalculation of the scanning conditions.

On the other hand, when the scan time is also required to be set equal to that in the default scanning conditions, the SN-ratio maintained scanning-condition recalculating unit 17e multiplies the number of acquisition NAQ by 1/k times. Accordingly, the SN ratio and the scan time can be set equal to those in the default scanning conditions. Whether or not to execute the processing of keeping the spatial resolution equal to its default scanning condition in this way can be initially set in advance as a default value, or can be selected by the operator on the spot.

For example, it is assumed that when FOVp in the default scanning conditions is 256 millimeters, the operator or the system then sets FOVp to 307 millimeters, which is 1.2 times its default scanning condition, because an examination subject is larger than 256 millimeters in terms of FOVp. In such case, the SN-ratio maintained scanning-condition recalculating unit 17e increases Np by 1.2 times to 307 so as to maintain the spatial resolution.

Accordingly, based on the relation expressed in Expression (1), the SN ratio becomes $\sqrt{1.2}$ times its default scanning condition; while the scan time becomes 1.2 times its default scanning condition based on the relation expressed in Expression (2). When the selection that the scan time is to be equal to its default scanning condition is set, and if the number of acquisition in the default scanning conditions can be reduced, the number of acquisition can be 1/1.2 times its default scanning condition.

Figure 6:
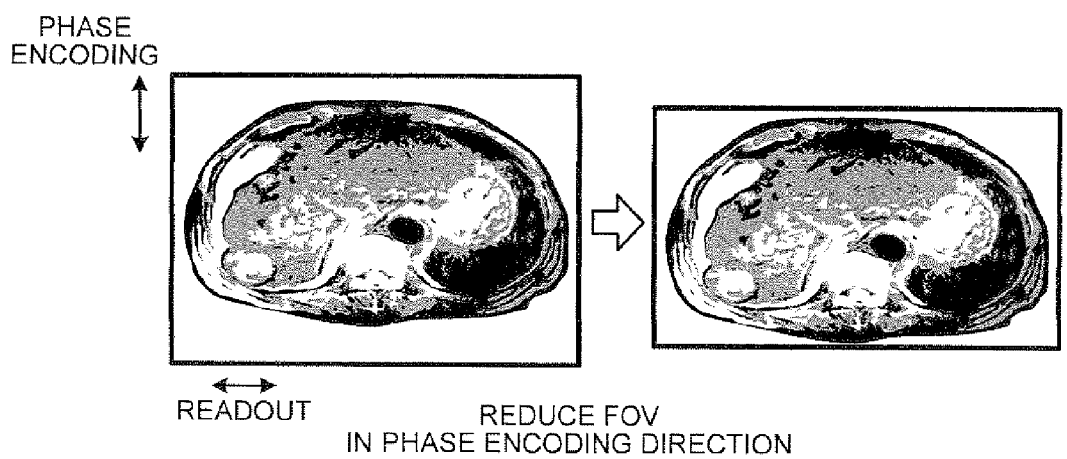
FIG. 6 is a schematic diagram of a case where an FOV in the phase encoding direction is reduced to k times (k<1) its default scanning condition in accordance with the size of a scan subject.

FIG. 6 shows a case where the FOV in the phase encoding direction FOVp is reduced to k times (k<1) its default scanning condition in accordance with the size of a scan subject.

In this case, the SN-ratio maintained scanning-condition recalculating unit 17e sets the same FOV in the phase encoding direction FOVp and the same phase encoding matrix Np as those in the default scanning conditions regardless of the size of the FOV in the phase encoding direction FOVp set by the operator or the system. The SN-ratio maintained scanning-condition recalculating unit 17e then controls the display unit 15 so as to display an area set by the operator or the system by cutting it out from an image reconstructed from collected data. Accordingly, based on the relation expressed in Expression (1) and Expression (2), the values of the SN ratio and the scan time in the default scanning conditions can be maintained.

For example, it is assumed that when FOVp in the default scanning conditions is 256 millimeters, the operator or the system then sets FOVp to 205 millimeters, which is 0.8 times its default scanning condition, because an examination subject is smaller than 256 millimeters in terms of FOVp. In such case, the SN-ratio maintained scanning-condition recalculating unit 17e sets FOVp and Np to 256 millimeters and 256, respectively, which are equal to those in the default scanning conditions. The SN-ratio maintained scanning-condition recalculating unit 17e then controls the display unit 15 so as to display the part of 205 millimeters set by the operator or the system by cutting it out from a reconstructed image.

As described above, when the FOV is changed, algorithms of recalculating another scanning condition vary depending on a direction of the FOV (the readout direction or the phase encoding direction), and whether the FOV is to be set to larger or smaller than its default scanning condition. Therefore, it is difficult for the operator to perform optimal setting manually; and it is effective to define recalculating methods of recalculating scanning conditions in advance pattern by pattern as described above in order to obtain a stable SN ratio.

A case of changing the spatial resolution in accordance with the size of a scan subject is explained below by dividing into four cases shown in FIGS. 3 to 6.

For example, when a scan subject, i.e., the physique of a subject, is smaller than the standard assumed in the default scanning conditions, an organ to be examined is correspondingly smaller, therefore correspondingly to such proportion, a spatial resolution required for diagnosis needs to be set higher. By contrast, when the physique of a subject is larger than the standard assumed in the default scanning conditions, the spatial resolution can be allowable to be decreased by the difference, in some cases.

For this reason, when the FOV is changed by the operator or the system, the SN-ratio maintained scanning-condition recalculating unit 17e achieves change in the spatial resolution in accordance with the size of a scan subject by setting the number of elements in a matrix equal to its default scanning condition.

At first, explained below is a case where the FOV in the readout direction FOVr is enlarged to k times (k>1) its default scanning condition in accordance with the size of a scan subject, as shown in FIG. 3. In this case, the SN-ratio maintained scanning-condition recalculating unit 17e maintains the readout matrix Nr without changing it from its default scanning condition. Accordingly, the voxel size is enlarged by k times and the SN ratio is improved to k times according to the relation expressed in Expression (1). A primary purpose of maintaining the value of the SN ratio equal to or higher than a reference value is achieved in this stage, so that the SN-ratio maintained scanning-condition recalculating unit 17e completes the recalculation of scanning conditions.

By contrast, when it is required that the scan time is to be reduced while maintaining the SN ratio, and if the number of acquisition NAQ can be reduced; the SN-ratio maintained scanning-condition recalculating unit 17e multiplies the number of acquisition NAQ by $1/k^2$ times. Accordingly, the scan time can be reduced compared with a case of scanning under the default scanning conditions. Whether or not to execute the processing of reducing the scan time from its default scanning condition while maintaining the SN ratio in this way can be initially set in advance as a default value, or can be selected by the operator on the spot.

For example, it is assumed that when FOVr in the default scanning conditions is 256 millimeters, the operator or the system sets FOVr to 307 millimeters, which is 1.2 times its default scanning condition, because an examination subject is larger than 256 millimeters in terms of FOVr. In such case, the SN-ratio maintained scanning-condition recalculating unit 17e maintains Nr at 256. Accordingly, the SN ratio is improved to 1.2 times its default scanning condition.

When the initial, setting is performed so as to execute the processing of reducing the scan time, or the operator selects an operation to execute the processing of reducing the scan time, the SN-ratio maintained scanning-condition recalculating unit 17e multiplies the number of acquisition by 1/1.22 times.

Then, explained below is a case where the FOV in the readout direction FOVr is reduced to k times (k<1) its default scanning condition in accordance with the size of a scan subject, as shown in FIG. 4. In this case, the SN-ratio maintained scanning-condition recalculating unit 17e maintains the readout matrix Nr without changing it from its default scanning condition. Accordingly, the voxel size is reduced by k times, and the SN ratio is decreased to k times according to the relation expressed in Expression (1).

The SN-ratio maintained scanning-condition recalculating unit 17e then increases the phase encoding matrix Np by $1/k^2$ times in order to compensate the decrease in the SN ratio. Moreover, the SN-ratio maintained scanning-condition recalculating unit 17e multiplies the FOV in the phase encoding direction FOVp also by $1/k^2$ times correspondingly to the change in Np, in order to maintain the spatial resolution. Accordingly, an image to be reconstructed is enlarged in the phase encoding direction, so that the SN-ratio maintained scanning-condition recalculating unit 17e controls the display unit 15 so as to display an area set by the operator or the system by cutting it out from an image reconstructed from collected data. The scan time is also extended to $1/k^2$ times its default scanning condition along with the increase in Np, based on the relation expressed in Expression (2).

For example, it is assumed that when FOVr in the default scanning conditions is 256 millimeters, the operator or the system sets FOVr to 205 millimeters, which is 0.8 times its default scanning condition, because an examination subject is smaller than 256 millimeters in terms of FOVr. In such case, the SN ratio is multiplied by 0.8 times, so that the SN-ratio maintained scanning-condition recalculating unit 17e multiplies Np by $1/0.8^2$ times to 400, and multiplies FOVp by $1/0.8^2$ times to 400 millimeters. The SN-ratio maintained scanning-condition recalculating unit 17e then controls the display unit 15 so as to display an area of which the span in the phase encoding direction is 256 millimeters by cutting out the area from a reconstructed image.

Then, as shown in FIG. 5, explained below is a case where the FOV in the phase encoding direction FOVp is enlarged to k times (k>1) its default scanning condition in accordance with the size of a scan subject. In this case, the SN-ratio maintained scanning-condition recalculating unit 17e maintains the phase encoding matrix Np without changing it from its default scanning condition. Accordingly, the voxel size is enlarged by k times, and the SN ratio is improved to k times according to the relation expressed in Expression (1). A primary purpose of maintaining the value of the SN ratio equal to or higher than the reference value is achieved in this stage, so that the SN-ratio maintained scanning-condition recalculating unit 17e completes the recalculation of scanning conditions.

By contrast, when it is required that the scan time is to be reduced while maintaining the SN ratio, and if the number of acquisition NAQ can be reduced; the SN-ratio maintained scanning-condition recalculating unit 17e multiplies the number of acquisition NAQ by $1/k^2$ times. Accordingly, the scan time can be reduced compared with a case of scanning under the default scanning conditions. Whether or not to execute the processing of reducing the scan time from its default scanning condition while maintaining the SN ratio in this way can be initially set in advance as a default value, or can be selected by the operator on the spot.

For example, it is assumed that when FOVp in the default scanning conditions is 256 millimeters, the operator or the system sets FOVp to 307 millimeters, which is 1.2 times its default scanning condition, because an examination subject is larger than 256 millimeters in terms of FOVp. In such case, the SN-ratio maintained scanning-condition recalculating unit 17e maintains Np at 256. Accordingly, the SN ratio is improved to 1.2 times its default scanning condition.

Then, explained below is a case where the FOV in the phase encoding direction FOVp is reduced to k times (k<1) its default scanning condition in accordance with the size of a scan subject, as shown in FIG. 6. In this case, as the SN-ratio maintained scanning-condition recalculating unit 17e maintains the phase encoding matrix Np without changing it from its default scanning condition, the voxel size is reduced by k times. Accordingly, the SN ratio is decreased to k times according to the relation expressed in Expression (1).

The SN-ratio maintained scanning-condition recalculating unit 17e then multiplies the phase encoding matrix Np by $1/k^2$ times in order to compensate the decrease in the SN ratio. Moreover, the SN-ratio maintained scanning-condition recalculating unit 17e sets a collection FOV FOVp' according to Expression (3) described below in order to set the spatial resolution to k times its default scanning condition.

$$FOVp' = ((FOVp/Np) \times k) \times (Np \times 1/k^2) \quad (3)$$
$$= FOVp \times 1/k$$

In other words, the SN-ratio maintained scanning-condition recalculating unit 17e sets FOVp' to 1/k times FOVp in the default scanning conditions. In this case, the SN-ratio maintained scanning-condition recalculating unit 17e then controls the display unit 15 so as to display an area set by the operator or the system by cutting it out from an image reconstructed from collected data.

For example, it is assumed that when FOVp in the default scanning conditions is 256 millimeters, the operator or the system sets FOVp to 205 millimeters, which is 0.8 times its default scanning condition, because an examination subject is smaller than 256 millimeters in terms of FOVp. In such case, the SN ratio is decreased by 0.8 times, so that the SN-ratio maintained scanning-condition recalculating unit 17e sets Np to $256 \times 1/0.8^2 = 400$, and sets FOVp to $256 \times 1/0.8 = 320$ millimeters. The SN-ratio maintained scanning-condition recalculating unit 17e then controls the display unit 15 so as to display an area of which the span in the phase encoding direction is 205 millimeters by cutting out the area from a reconstructed image.

Figure 7B:
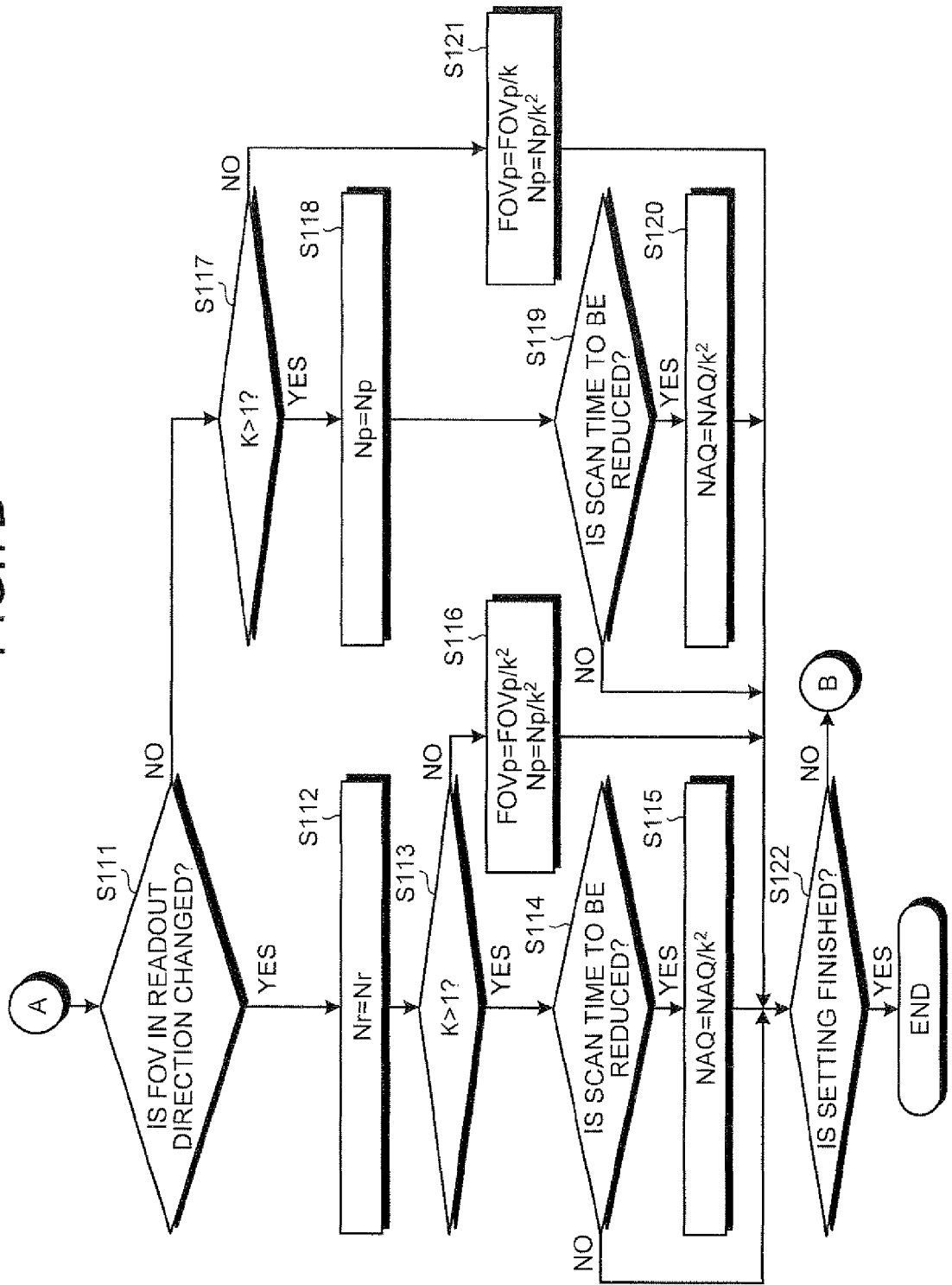

A flow of recalculation of scanning conditions according to the embodiment is explained below. FIGS. 7A and 7B are a flowchart of a flow of recalculation of scanning conditions according to the embodiment. The following description mainly explains processing performed by the SN-ratio maintained scanning-condition recalculating unit 17e, and it is assumed that whether or not to fix the spatial resolution and whether or not to reduce the scan time are initially set in advance.

As shown in FIG. 7A, when the FOV is changed by the operator or the system (hereinafter, an enlargement/reduction rate is denoted by k) (Yes at Step S101), the SN-ratio maintained scanning-condition recalculating unit 17e determines whether it is set to fix the spatial resolution (Step S102).

If it is set to fix the spatial resolution (Yes at Step S102), the SN-ratio maintained scanning-condition recalculating unit 17e determines whether the FOV in the readout direction is changed (Step S103).

If the FOV in the readout direction is changed (Yes at Step S103), the SN-ratio maintained scanning-condition recalculating unit 17e multiplies the readout matrix Nr by k times (Step S104).

By contrast, if the FOV in the phase encoding direction is changed (No at Step S103), the SN-ratio maintained scanning-condition recalculating unit 17e determines whether the FOV in the phase encoding direction is enlarged (whether or not k>1) (Step S105).

If the FOV in the phase encoding direction is enlarged (Yes at Step S105), the SN-ratio maintained scanning-condition recalculating unit 17e multiplies the phase encoding matrix Np by k times (Step S106), and then determines whether it is set to reduce the scan time (Step S107).

If it is set to reduce the scan time (Yes at Step S107), the SN-ratio maintained scanning-condition recalculating unit 17e multiplies the number of acquisition NAQ by 1/k times (Step S108). If it is not set to reduce the scan time (No at Step S107), the SN-ratio maintained scanning-condition recalculating unit 17e does not change NAQ.

By contrast, if the FOV in the phase encoding direction is reduced (No at Step S105), the SN-ratio maintained scanning-condition recalculating unit 17e does not change the FOV in the phase encoding direction FOVp and the phase encoding matrix Np (Step S109).

In this way, the SN-ratio maintained scanning-condition recalculating unit 17e repeats the above processing while the FOV is being changed (No at Step S110). When setting of the FOV by the operator or the system is finished (Yes at Step S110), the recalculation of the scanning parameters is terminated.

At Step S102, if it is not set to fix the spatial resolution (No at Step S102), as shown in FIG. 7B, the SN-ratio maintained scanning-condition recalculating unit 17e determines whether the FOV in the readout direction is changed (Step S111).

If the FOV in the readout direction is changed (Yes at Step S111), the SN-ratio maintained scanning-condition recalculating unit 17e dose not change the readout matrix Nr from its default scanning condition (Step S112), and then determines whether the FOV in the readout direction is enlarged (whether or not k>1) (Step 3113).

If the FOV in the readout direction is enlarged (Yes at Step S113), the SN-ratio maintained scanning-condition recalculating unit 17e determines whether it is set to reduce the scan time (Step S114).

If it is set to reduce the scan time (Yes at Step S114), the SN-ratio maintained scanning-condition recalculating unit 17e multiplies the number of acquisition NAQ by $1/k^2$ times (Step S115). If it is not set to reduce the scan time (No at Step S114), the SN-ratio maintained scanning-condition recalculating unit 17e does not change NAQ.

By contrast, if the FOV is reduced in the phase encoding direction (No at Step S113), the SN-ratio maintained scanning-condition recalculating unit 17e multiplies each of the FOV in the phase encoding direction FOVp and the phase encoding matrix Np by $1/k^2$ times (Step S116).

At Step S111, if the FOV in the phase encoding direction is changed (No at Step S111), the SN-ratio maintained scanning-condition recalculating unit 17e determines whether the FOV in the phase encoding direction is enlarged (whether or not k>1) (Step S111).

If the FOV in the phase encoding direction is enlarged (Yes at Step S117), the SN-ratio maintained scanning-condition recalculating unit 17e does not change the phase encoding matrix Np from its default scanning condition (Step S118), and then determines whether it is set to reduce the scan time (Step S119).

If it is set to reduce the scan time (Yes at Step S119), the SN-ratio maintained scanning-condition recalculating unit 17e multiplies the number of acquisition NAQ by $1/k^2$ times (Step S120). If it is not set to reduce the scan time (No at Step S119), the SN-ratio maintained scanning-condition recalculating unit 17e does not change NAQ.

By contrast, if the FOV in the phase encoding direction is reduced (No at Step S117), the SN-ratio maintained scanning-condition recalculating unit 17e multiplies the FOV in the phase encoding direction FOVp by 1/k times, and multiplies the phase encoding matrix Np by $1/k^2$ times (Step S121).

In this way, the SN-ratio maintained scanning-condition recalculating unit 17e repeats the above processing while the FOV is being changed (No at Step S122). When setting of the FOV by the operator or the system is finished (Yes at Step S122), the recalculation of the scanning parameters is terminated.

As described above, according to the embodiment, when the size of an FOV to be set for a scan is changed, the SN-ratio maintained scanning-condition recalculating unit 17e re-sets the value of another scanning parameter included in scanning conditions so as to make the SN ratio of an image to be taken under after-change scanning conditions equal to or larger than the SN ratio of an image assumed to be taken under before-change scanning conditions. The scanning-condition edit/scan positioning unit 17a then sets scanning conditions based on the scanning parameter recalculated by the scanning-condition recalculating unit. Accordingly, according to the embodiment, even when the size of the FOV is adjusted in accordance with the size of a scan subject, an image of the same SN ratio as that of a reference image can be constantly obtained, so that even an inexperienced operator can easily take an image of a stable image quality.

The embodiment is explained above in the case where the FOV in the readout direction FOVr and the FOV in the phase encoding direction FOVp in two-dimensional scanning are changed in accordance with the size of a scan subject. However, the present invention is not limited this, and can be similarly applied to a case where the slice thickness is changed.

As is clear from the relation expressed in Expression (1), the SN ratio changes proportionally to a slice thickness ST from the default scanning conditions. When the slice thickness ST is changed, the SN-ratio maintained scanning-condition recalculating unit 17e changes the number of acquisition NAQ or the phase encoding matrix Np so as to maintain the SN ratio.

Moreover, although the embodiment is explained about two-dimensional scanning, the present invention is not limited to this, and can be similarly applied to three-dimensional scanning. In some cases of three-dimensional scanning, the operator or the system sometimes changes an FOV in a slice direction, i.e., the slab thickness. The SN ratio of an image taken by three-dimensional scanning, which performs phase encoding also in the slice direction, can be expressed by Expression (4) as follows:

$$S/N \propto \text{voxel size} \times \sqrt{\frac{\text{total data}}{\text{collection time}}} = (FOVp/Np) \times \quad (4)$$
$$(FOVr/Nr) \times$$
$$(FOVs/Ns) \times$$
$$\sqrt{\frac{NAQ \times Np \times Ns \times}{Nr \times \Delta t}}$$
$$= (FOVp/Np) \times$$
$$(FOVr/Nr)$$
$$(FOVs/Ns) \times$$
$$\sqrt{\frac{NAQ \times Np \times}{Ns/BW}}$$

In Expression (4), FOVp denotes the FOV in the phase encoding direction, FOVr denotes the FOV in the readout direction, FOVs denotes the FOV in the slice direction (slab thickness), Np denotes the number of elements in the phase encoding direction in a matrix, Nr denotes the number of elements in the readout direction in the matrix, Ns denotes the number of elements in the slice direction in the matrix (hereinafter, referred to as "slice encoding matrix"), NAQ denotes the number of acquisition, $\Delta t$ denotes the sampling pitch, and BW denotes a signal band per pixel.

The scan time Tacq can be expressed by Expression (5) as follows:

$$Tacq \propto TR \times NAQ \times Np \times Ns \quad (5)$$

Also when the FOV in the slice direction in three-dimensional scanning is changed, there are two cases, namely, a case where it is required to maintain the default scanning condition of the spatial resolution, and a case where it is required to change the spatial resolution in accordance with the size of a scan subject. Basically, processing and effects on the FOV in the slice direction and those on the FOV in the phase encoding direction are the same.

Recalculation of scanning parameters in three-dimensional scanning performed by the SN-ratio maintained scanning-condition recalculating unit 17e is explained below in detail with reference to FIGS. 8 and 9. Explained below are also a case of maintaining the same spatial resolution as its default scanning condition that is preliminarily registered, and a case of changing the spatial resolution in accordance with the size of a scan subject.

The case of maintaining the same spatial resolution as its default scanning condition is explained below at first, by dividing into two cases shown in FIGS. 8 and 9.

Figure 8:
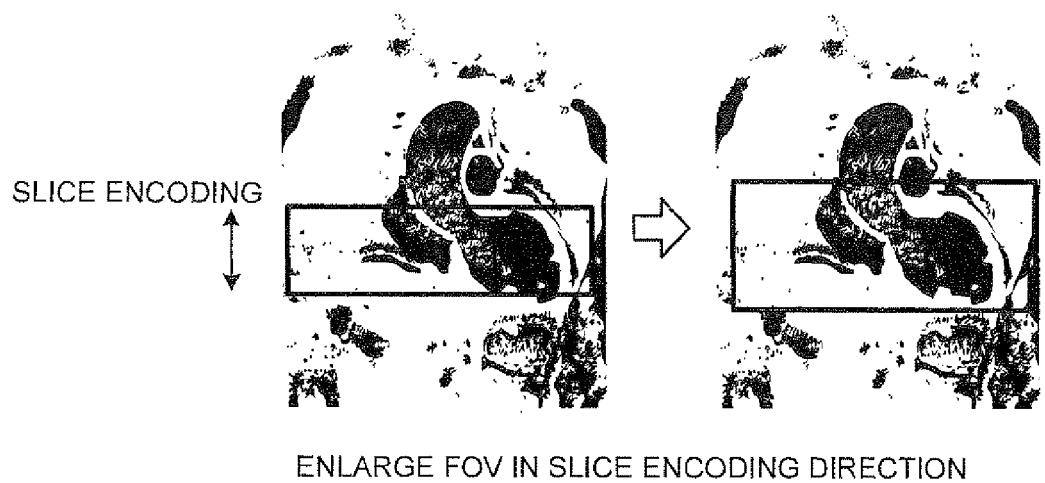
FIG. 8 is a schematic diagram of a case where an FOV in a slice encoding direction is enlarged to k times (k>1) its default scanning condition in accordance with the size of a scan subject.

FIG. 8 shows a case where the FOV in the slice direction FOVs is enlarged to k times (k>1) its default scanning condition in accordance with the size of a scan subject.

In this case, the SN-ratio maintained scanning-condition recalculating unit 17e multiplies the slice encoding matrix Ns by k times in order to meet the default scanning condition of the spatial resolution. Accordingly, based on the relation expressed in Expression (4), the SN ratio is improved to $\sqrt{k}$ times its default scanning condition. Based on the relation expressed in Expression (5), the scan time is extended by k times. If an extension of the scan time is accepted, the SN-ratio maintained scanning-condition recalculating unit 17e only multiplies Ns by k times, and completes the recalculation of the scanning conditions.

On the other hand, when the scan time is also required to be set equal to its default scanning condition, the SN-ratio maintained scanning-condition recalculating unit 17e multiplies the number of acquisition NAQ by 1/k times. Accordingly, the SN ratio and the scan time can be set equal to those in the default scanning conditions.

Figure 9:
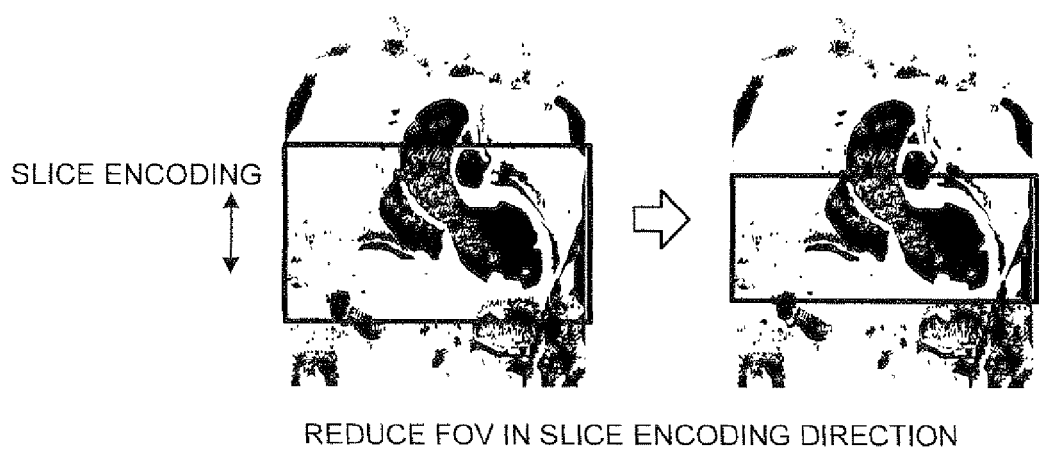
FIG. 9 is a schematic diagram of a case where an FOV in the slice encoding direction is reduced to k times (k<1) its default scanning condition in accordance with the size of a scan subject.

FIG. 9 shows a case where the FOV in the slice direction FOVs is reduced to k times (k<1) its default scanning condition in accordance with the size of a scan subject.

In this case, the SN-ratio maintained scanning-condition recalculating unit 17e sets the FOV in the slice direction FOVs and the slice encoding matrix Ns equal to those in the default scanning conditions, regardless of the size of the FOV in the slice direction FOVs that is set by the operator or the system. The SN-ratio maintained scanning-condition recalculating unit 17e then controls the display unit 15 so as to display an area set by the operator or the system by cutting it out from an image reconstructed from collected data. Accordingly, according to the relation expressed in Expression (4) and Expression (5), the values of the SN ratio and the scan time in the default scanning conditions can be maintained.

Then, patterns shown in FIGS. 8 and 9 are explained below in a case of changing the spatial resolution in accordance with the size of the scan subject.

At first, as shown in FIG. 8, explained below is a case where the FOV in the slice direction FOVs is enlarged to k times (k>1) its default scanning condition in accordance with the size of a scan subject. In this case, the SN-ratio maintained scanning-condition recalculating unit 17e maintains the slice encoding matrix Ns without changing it from its default scanning condition. Accordingly, the voxel size is enlarged by k times, and the SN ratio is improved to k times according to the relation expressed in Expression (4). A primary purpose of maintaining the value of the SN ratio equal to or higher than the reference value is achieved in this stage, so that the SN-ratio maintained scanning-condition recalculating unit 17e completes the recalculation of scanning conditions.

By contrast, when it is required that the scan time is reduced while maintaining the SN ratio, the SN-ratio maintained scanning-condition recalculating unit 17e multiplies the number of acquisition NAQ by $1/\sqrt{k}$ times. Accordingly, the scan time can be reduced compared with a case of scanning under the default scanning conditions.

Then, explained below is a case where the FOV in the slice direction FOVs is reduced to k times (k<1) its default scanning condition in accordance with the size of a scan subject, as shown in FIG. 9. In this case, the SN-ratio maintained scanning-condition recalculating unit 17e maintains the slice encoding matrix Ns without changing it from its default scanning condition. Accordingly, the voxel size is reduced by k times, and the SN ratio is decreased to k times according to the relation expressed in Expression (4).

The SN-ratio maintained scanning-condition recalculating unit 17e then increases the slice encoding matrix Ns to $1/k^2$ times its default scanning condition in order to compensate the decrease in the SN ratio. Moreover, the SN-ratio maintained scanning-condition recalculating unit 17e increases FOVs to 1/k times its default scanning condition. Accordingly, a reconstructed image is enlarged in the slice direction, so that the SN-ratio maintained scanning-condition recalculating unit 17e controls the display unit 15 so as to display an area of k times its default scanning condition set by the operator or the system by cutting out the area from the reconstructed image.

In this way, when the FOV in the slice direction is changed, the SN-ratio maintained scanning-condition recalculating unit 17e re-sets the value of another scanning parameter included in the scanning conditions so as to make the SN ratio of an image to be taken under after-change scanning conditions equal to or Larger than the SN ratio of an image assumed to be taken under before-change scanning conditions Accordingly, even when the size of the FOV is adjusted in accordance with the size of a scan subject, an image of the same SN ratio as that of a reference image can be constantly obtained, so that even an inexperienced operator can easily take an image of a stable image quality.

Moreover, although the embodiment is explained above in the case of automatically re-setting the value of another scanning parameter when the size of the FOV is changed, the present invention is not limited to this. For example, before re-setting the value of a scanning parameter, it can be configured to notify the operator of a result of recalculation.

In such case, for example, after the SN-ratio maintained scanning-condition recalculating unit 17e recalculates the value of a scanning parameter, the SN-ratio maintained scanning-condition recalculating unit 17e displays the recalculated value on the scanning-condition edit screen, and inquires of the operator whether or not to set scanning conditions with the displayed value of the scanning parameter. When displaying, for example, it can be configured to display each scanning parameter of which value is changed through the recalculation in a different manner from the other scanning parameters, for example, by changing a color in display, or by flashing in display.

When an instruction is given by the operator to set scanning conditions with the displayed value of a scanning parameter, the scanning-condition edit/scan positioning unit 17a stores the value of the scanning parameter that is displayed at the moment into the storage unit 14 as the examination information 14a via the scanning-parameter limit calculating unit 17b. In this way, the operator is once notified of a recalculated value of a scanning parameter, thereby selecting whether or not to set the recalculated value directly as a scanning condition.

As described above, the magnetic resonance imaging apparatus and the scanning-condition setting method according to the embodiment of the present invention are useful when adjustment of an FOV is required in accordance with the size of a scan subject, and particularly suitable when it is required to set scanning conditions in which the same SN ratio is constantly maintained while changing the FOV.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus that images an inside of a subject by using a magnetic resonance phenomenon, the apparatus comprising:
a scanning-condition recalculating unit that recalculates a value of a scanning parameter other than a Signal-to-Noise (SN) ratio included in scanning conditions when a size of a Field Of View (FOV) to be set for a scan is changed, so as to make an SN ratio of an image to be taken under after-change scanning conditions be one of a value equal to and a value larger than an SN ratio of an image assumed to be taken under before-change scanning conditions; and
a scanning-condition setting unit that sets a scanning condition based on the value of the scanning parameter recalculated by the scanning-condition recalculating unit.

2. The apparatus according to claim 1, wherein when a size of the FOV is changed in a readout direction, the scanning-condition recalculating unit increases or decreases number of elements in the readout direction in a matrix included in scanning conditions so as to make a spatial resolution equal to a spatial resolution of an image assumed to be taken under before-change scanning conditions.

3. The apparatus according to claim 1, wherein when a size of the FOV is enlarged in a phase encoding direction, the scanning-condition recalculating unit increases number of elements in the phase encoding direction in a matrix included in scanning conditions so as to make a spatial resolution equal to a spatial resolution of an image assumed to be taken under before-change scanning conditions.

4. The apparatus according to claim 2, wherein when a size of the FOV is enlarged in a phase encoding direction, the scanning-condition recalculating unit increases number of elements in the phase encoding direction in a matrix included in scanning conditions so as Lo make a spatial resolution equal to a spatial resolution of an image assumed to be taken under before-change scanning conditions.

5. The apparatus according to claim 1, wherein when a size of the FOV is reduced in a phase encoding direction, the scanning-condition recalculating unit sets an FOV and number of elements in the phase encoding direction in a matrix included in before-change scanning conditions as after-change scanning conditions, and performs control so as to display an area of the reduced FOV by cutting out the area from an image to be obtained through a scan.

6. The apparatus according to claim 2, wherein when a size of the FOV is reduced in a phase encoding direction, the scanning-condition recalculating unit sets an FOV and number of elements in the phase encoding direction in a matrix included in before-change scanning conditions as after-change scanning conditions, and performs control so as to display an area of the reduced FOV by cutting out the area from an image to be obtained through a scan.

7. The apparatus according to claim 3, wherein when a size of the FOV is reduced in a phase encoding direction, the scanning-condition recalculating unit sets an FOV and number of elements in the phase encoding direction in a matrix included in before-change scanning conditions as after-change scanning conditions, and performs control so as to display an area of the reduced FOV by cutting out the area from an image to be obtained through a scan.

8. The apparatus according to claim 1, wherein when a size of the FOV is enlarged in a readout direction, the scanning-condition recalculating unit sets number of elements in the readout direction in a matrix included in before-change scanning conditions as an after-change scanning conduction.

9. The apparatus according to claim 1, wherein when a size of the FOV is reduced in a readout direction, the scanning-condition recalculating unit sets number of elements in the readout direction in a matrix included in before-change scanning conditions as an after-change scanning condition, increases number of elements in the phase encoding direction in the matrix and a size of the FOV in the phase encoding direction in accordance with a reduction rate of the FOV, and performs control so as to display an area of the reduced FOV by cutting out the area from an image to be obtained through a scan.

10. The apparatus according to claim 8, wherein when a size of the FOV is reduced in a readout direction, the scanning-condition recalculating unit sets number of elements in the readout direction in a matrix included in before-change scanning conditions as an after-change scanning condition, increases number of elements in the phase encoding direction in the matrix and a size of the FOV in the phase encoding direction in accordance with a reduction rate of the FOV, and performs control so as to display an area of the reduced FOV by cutting out the area from an image to be obtained through a scan.

11. The apparatus according to claim 1, wherein when a size of the FOV is enlarged in a phase encoding direction, the scanning-condition recalculating unit sets number of elements in the phase encoding direction in a matrix included in before-change scanning conditions as an after-change scanning condition.

12. The apparatus according to claim 8, wherein when a size of the FOV is enlarged in a phase encoding direction, the scanning-condition recalculating unit sets number of elements in the phase encoding direction in a matrix included in before-change scanning conditions as an after-change scanning condition.

13. The apparatus according to claim 1, wherein when a size of the FOV is reduced in a phase encoding direction, the scanning-condition recalculating unit increases number of elements in the phase encoding direction in a matrix and a size of an FOV in the phase encoding direction in accordance with a reduction rate of the FOV, and performs control so as to display an area of the reduced FOV by cutting out the area from an image to be obtained through a scan.

14. The apparatus according to claim 8, wherein when a size of the FOV is reduced in a phase encoding direction, the scanning-condition recalculating unit increases number of elements in the phase encoding direction in a matrix and a size of an FOV in the phase encoding direction in accordance with a reduction rate of the FOV, and performs control so as to display an area of the reduced FOV by cutting out the area from an image to be obtained through a scan.

15. The apparatus according to claim 3, wherein the scanning-condition setting unit decreases number of acquisition within such a range that an SN ratio of an image to be taken under after-change scanning conditions is to be one of a value equal to and a value larger than an SN ratio of an image assumed to be taken under before-change scanning conditions.

16. The apparatus according to claim 8, wherein the scanning-condition setting unit decreases number of acquisition within such a range that an SN ratio of an image to be taken under after change scanning conditions is to be one of a value equal to and a value larger than an SN ratio of an image assumed to be taken under before-change scanning conditions.

17. The apparatus according to claim 11, wherein the scanning-condition setting unit decreases number of acquisition within such a range that an SN ratio of an image to be taken under after-change scanning conditions is to be one of a value equal to and a value larger than an SN ratio of an image assumed to be taken under before-change scanning conditions.

18. The apparatus according to claim 1, further comprising a scanning-condition notifying unit that provides a notice of the value of the scanning parameter recalculated by the scanning-condition recalculating unit.

19. A magnetic resonance imaging apparatus that images an inside of a subject by using a magnetic resonance phenomenon, the apparatus comprising:
    a scanning-condition recalculating unit that recalculates a value of a scanning parameter other than a Signal-to-Noise (SN) ratio included in scanning conditions when a size of a Field Of View (FOV) to be set for a scan is changed, so as to make an SN ratio of an image to be taken under after-change scanning conditions be one of a value equal to and a value larger than an SN ratio of an image assumed to be taken under before-change scanning conditions; and
    a scanning-condition notifying unit that provides a notice of the value of the scanning parameter recalculated by the scanning-condition recalculating unit.

20. A scanning-condition setting method of a magnetic resonance imaging apparatus, the method comprising:
    recalculating a value of a scanning parameters other than an SN ratio included in scanning conditions when a size of an FOV to be set for a scan is changed, so as to make an SN ratio of an image to be taken under after-change scanning conditions be one of a value equal to and a value larger than an SN ratio of an image assumed to be taken under before-change scanning conditions; and
    setting a scanning condition based on the recalculated value of the scanning parameter.

* * * * *